United States Patent [19]

Kitazawa

[11] Patent Number: 5,255,243
[45] Date of Patent: Oct. 19, 1993

[54] RANDOM ACCESS MEMORY DEVICE HAVING TRANSFER GATE UNIT FOR BLOCKING FLASH WRITE DATA BUFFER UNIT FROM PARASITIC CAPACITANCE COUPLED WITH BIT LINE PAIRS OF MEMORY CELLS

[75] Inventor: Eiji Kitazawa, Kanagawa, Japan

[73] Assignee: NEC Corporation, Tokyo, Japan

[21] Appl. No.: 789,897

[22] Filed: Nov. 12, 1991

[30] Foreign Application Priority Data

Nov. 9, 1990 [JP] Japan .................................. 2-305385

[51] Int. Cl.$^5$ .......................... G11C 8/00; G11C 7/00
[52] U.S. Cl. .................................. 365/233; 365/189.01
[58] Field of Search .................. 365/233, 189.01, 190, 365/230.03, 218

[56] References Cited

U.S. PATENT DOCUMENTS

| | | | |
|---|---|---|---|
| 5,003,510 | 3/1991 | Kamisaki | 365/230.03 |
| 5,046,049 | 9/1991 | Enoi et al. | 365/201 |
| 5,134,589 | 7/1992 | Hamano | 365/218 |
| 5,140,553 | 8/1992 | Choi et al. | 365/218 |
| 5,155,705 | 10/1992 | Goto et al. | 365/233 |

Primary Examiner—Eugene R. LaRoche
Assistant Examiner—Tan Nguyen
Attorney, Agent, or Firm—Sughrue, Mion, Zinn, Macpeak & Seas

[57] ABSTRACT

A dynamic random access memory device enters a flash write phase of operation for writing a flash write data bit into a plurality of random access memory cells, and the flash write data bit is transferred from a flash write data buffer unit through a transfer gate unit, a set of bit line pairs respectively coupled with sense amplifier circuits, another transfer gate unit and another set of bit line pairs coupled with a random access memory cell array, wherein another transfer gate unit blocks the flash write data buffer unit and the sense amplifier circuits from parasitic capacitances coupled with another set of bit line pairs so that the flash write data buffer unit with small current driving capability rapidly produces small differential voltage levels indicative of the flash write data bit on the bit line pairs coupled with the sense amplifier circuits.

5 Claims, 4 Drawing Sheets

RANDOM ACCESS MEMORY DEVICE HAVING TRANSFER GATE UNIT FOR BLOCKING FLASH WRITE DATA BUFFER UNIT FROM PARASITIC CAPACITANCE COUPLED WITH BIT LINE PAIRS OF MEMORY CELLS

FIELD OF THE INVENTION

This invention relates to a random access memory device and, more particularly, to a controlling sequence of a flash write cycle for decreasing parasitic capacitance driven by a flash write data buffer unit.

DESCRIPTION OF THE RELATED ART

A random access memory device has been expected to improve the access speed, and reduction of the parasitic capacitance coupled to the bit lines effectively decrease the access time. For the reduction of the parasitic capacitance, transfer gates are provided in bit line pairs, and the transfer gates isolate sense amplifier units from parts of the bit lines which are not available for propagation of data bits. On the other hand, various additional functions have been provided for the random access memory device, and one of the popular additional functions is known as "flash write cycle". In the flash write cycle, a flash write data bit is concurrently written into a plurality of memory cells, and a flash write data buffer unit concurrently drives the associated bit line pairs. In order to reduce the parasitic capacitance coupled to each of the bit line pairs, the transfer gates also turn off at a predetermined timing, and the switching actions of the transfer gates take place at the same timing as the usual access.

A typical example of the random access memory device with the flash write cycle is illustrated in FIG. 1 of the drawings, and comprises a memory cell array 1 implemented by memory cells M11, M12, M1n, Mm1, Mm2 and Mmn arranged in matrix. A series combination of an n-channel enhancement type transfer transistor and a storage capacitor forms each of the memory cells M11 to Mmn. The memory cells M11 to Mmn are associated with bit line pairs BP1, BP2 and BPn, and each of the bit line pairs BP1 to BPn consists of bit lines BLa and BLb. The memory cells of each column are alternately coupled with the bit lines BLa and BLb of the associated bit line pair, and parasitic capacitance C1 is coupled with each bit line BLa or BLb. For example, the memory cell M11 is coupled with the left bit line BLa of the bit line pair BP1, and the memory cell Mm1 is coupled with the other bit line BLb of the bit line pair BP1. Word lines WL1 to WLm are associated with the rows of the memory cells M11 to Mmn, and gate the n-channel enhancement type transfer transistors of the associated memory cells for coupling the storage capacitors with the associated bit lines BLa and BLb.

A precharging unit 2 is coupled with the bit line pairs BP1 to BPn, and is fabricated from n-channel enhancement type field effect transistors. The precharging unit 2 is responsive to a precharging signal PDL for simultaneously coupling the bit line pairs BP1 to BPn with a source line VR of the precharging level, and is operative to precharge the bit line pairs BP1 to BPn to the precharging level and further to equalize the bit lines BLa and BLb to each other.

Another set of bit line pairs BQ1, BQ2 and BQn are provided for sense amplifier circuits SA1, SA2 and SAn, and the bit line pairs BQ1 to BQn respectively correspond to the bit line pairs BP1 to BPn. A first transfer gate unit 3 is provided between the bit line pairs BP1 to BPn and another set of bit line pairs BQ1 to BQn, and is implemented by n-channel enhancement type field effect transistors. The n-channel enhancement type field effect transistors are coupled between the bit lines BLa and BLb and the corresponding bit lines BLc and BLd of the bit line pairs BQ1 to BQn. The first transfer gate unit 3 is responsive to a first gate control signal TG1, and interconnects the bit line pairs BP1 to BPn and the corresponding bit line pairs BQ1 to BQn. The sense amplifier circuits SA1 to SAn are associated with a driving unit 4, and the driving unit 4 is responsive to an activation signal SE so that the sense amplifier circuits SA1 to SAn increase small differential voltages on the bit line pairs BQ1 to BQn. Since parasitic capacitance C2 is also coupled with each of the bit lines BLc and BLd, each of the sense amplifier circuits SA1 to SAn selectively charges and discharges the parasitic capacitances C2 coupled with the associated bit line pairs BQ1 to BQn. Though not shown in the drawings, the bit line pairs BQ1 to BQn are coupled with a column selecting unit, and the column selecting unit couples an input/output data buffer unit with one of the bit line pairs BQ1 to BQn.

The bit line pairs BQ1 to BQn are further coupled with a second transfer gate unit 5 which is fabricated from n-channel enhancement type field effect transistors. A flash write data bus FDB is further coupled with the second transfer unit 5, and a flash write data buffer unit 6 drives the flash write data bus FDB. The n-channel enhancement type field effect transistors of the second transfer gate unit 5 are concurrently responsive to a second gate control signal TG2, and simultaneously couple the flash write data bus FDB with the bit line pairs BQ1 to BQn. Therefore, a flash write data bit in the form of differential voltage level is transferred from the flash write data bus FDB to all of the bit line pairs BQ1 to BQn.

The dynamic random access memory device thus arranged selectively enters a usual read-out cycle, a usual write-in cycle and a flash write cycle. The usual read-out cycle and the flash write cycle are described in detail with reference to FIGS. 2 and 3, respectively. Assuming now that the memory cell M11 is accessed in a usual read-out cycle, the precharging signal PDL is lifted to an active high voltage level, and the precharging unit 1 precharges and equalizes the bit lines BLa and BLb at the precharging level. Since the first gate control signal TG1 is in the active high voltage level, the bit line pairs BP1 to BPn are coupled with the bit line pairs BQ1 to BQn, and the bit line pairs BQ1 to BQn also reach the precharging level. However, the activation signal SE is kept low, and the sense amplifier circuits SA1 to SAn remain inactive.

If the precharging signal PDL is decayed at time t1, the precharging unit 2 isolates the bit line pairs BP1 to BPn from the source line VR, and the bit line pairs BP1 to BPn and BQ1 to BQn enter floating state. The word line WL1 is lifted to the active high voltage level at time t2, and the storage capacitors of the memory cells M11 to M1n are coupled with the associated bit lines BLa. The memory cell M11 produces a small differential voltage level between the bit lines BLa and BLb of the bit line pair BP1, and the small differential voltage is transferred through the first transfer gate unit 3 to the bit line pair BQ1. At time t3, the first gate control signal TG1 is decayed, and the activation signal SE goes up to an active level. The n-channel enhancement type field effect transistors of the first transfer gate unit 3 concurrently turn off, and the sense amplifier circuits SA1 to SAn are blocked from the parasitic capacitances C1. Then, the sense amplifier circuits SA1 to SAn are activated with the activation signal SE, and respectively increase the small differential voltage levels on the bit line pairs BQ1 to BQn. The sense amplifier circuits SA1 to SAn are expected to drive the parasitic capacitances C2 only, and, for this reason, the small differential voltage levels are rapidly developed into large differential voltage levels, respectively. However, the differential voltage levels on the bit line pairs BP1 to BPn remain small, because the first transfer gate unit 3 has been turned off. The large differential voltage levels are transferred to the column selecting unit (not shown), and the differential voltage level on the bit line pair BQ1 is supplied to the input/output data buffer unit (not shown) for producing an output data signal. The first gate control signal TG1 is lifted to the high voltage level again at time t4, and the large differential voltage levels developed by the sense amplifier circuits SA1 to SAn are fed back to the bit line pairs BP1 to BPn for refreshing.

In a flash write cycle, the precharging signal PDL allows the precharging unit 2 to precharge and equalize the bit line pairs BP1 to BPn, and the first transfer gate unit 3 transfers the precharging level to the bit line pairs BQ1 to BQn in the presence of the first gate control signal TG1 of the active high voltage level. A flash write data bit is supplied to the flash write data buffer unit 6, and differential voltage level takes place on the flash write data bus FDB. At time t11, the precharging signal PDL is recovered to the inactive low voltage level, and the second gate control signal TG2 is lifted to the active high voltage level. The bit line pairs BP1 to BPn and, accordingly, the bit line pairs BQ1 to BQn are isolated from the source line VR, and the flash write data bus FDB is conducted to the bit line pairs BQ1 to BQn. Since the first transfer gate unit 3 interconnects the bit line pairs BP1 to BPn and the bit line pairs BQ1 to BQn, the flash write data buffer unit 6 is expected to drive not only the bit line pairs BP1 to BPn but also the bit line pairs BQ1 to BQn for producing the difference voltage level indicative of the flash write data bit on the bit line pairs BP1 to BPn and BQ1 to BQn. The word line WL1 is lifted to the active high voltage level at time t12, and the storage capacitors of the memory cells M11 to M1n are coupled with the associated bit lines BLa. If the data bits stored in the memory cells M11 to M1n are identical in logic level with the flash write data bit, the differential voltage levels already produced on the bit line pairs BP1 to BPn are continuously developed by the flash write data buffer unit 6. However, if the data bit stored in one of the memory cells M11 to M1n is opposite in logic level to the flash write data bit, the associated bit line BLa is inverted with respect to the bit line BLb as shown in FIG. 3, and the flash write data buffer unit 6 is expected to inverse the bit lines BLa and BLb again. At time t13, the first gate control signal TG1 is decayed, and the activation signal SE allows the driving unit 4 to activate the sense amplifier circuits SA1 to SAn. Thus, the first gate control signal TG1 and the activation signal SE are concurrently changed in both usual read-out and flash write cycles. The first transfer gate unit 3 isolates the sense amplifier circuits SA1 to SAn from the parasitic capacitances C1 coupled with the bit lines BLa and BLb, and the sense amplifier circuits SA1 to SAn increase the differential voltage levels on the bit line pairs BQ1 to BQn. However, the differential voltage levels on the bit line pairs BP1 to BPn remain small, because the first transfer gate unit 3 have turned off. The first gate control signal TG1 is lifted to the active high voltage level again at time t14, and the first transfer gate unit 3 couples the bit line pairs BP1 to BPn with the bit line pairs BQ1 to BQn. Then, the sense amplifier circuits SA1 to SAn further develop the differential voltage levels on the bit line pairs BP1 to BPn, and the voltage levels on the bit lines BLa are stored in the storage capacitors of the memory cells M11 to M1n.

A problem is encountered in the prior art random access memory device in the flash write data buffer unit 6. As described above, the flash write data buffer unit 6 is expected to drive all of the bit line pairs BP1 to BPn and BQ1 to BQn and further to invert the voltage levels on some bit line pairs in case of the flash write data bit opposite to the data bits already stored in the memory cells. In order to charge or discharge the parasitic capacitances C1 and C2 coupled with the bit lines BLa and BLc, or BLb and BLd, the flash write data buffer unit 6 needs to have a large current driving capability, and the component transistors of the flash write data buffer unit 6 tend to be enlarged. If the random access memory device increases the number of the memory cells, the flash write data buffer unit 6 occupies a large amount of real estate, and the large amount of current driven by the flash write data buffer unit 6 is causative of undesirable fluctuation of power voltage levels. On the contrary, if the flash write data buffer unit 6 is small in current driving capability, the time period between times t11 to t13 is prolonged, This results in a low operation speed. Thus, there is a trade-off between a flash write data buffer unit with large current driving capability and a flash write data buffer unit with small current driving capability.

SUMMARY OF THE INVENTION

It is therefore an important object of the present invention to provide a random access memory device which achieves a high speed operation by means of a flash write data buffer unit with small current driving capability.

To accomplish the object, the present invention proposes to block a flash write data buffer unit from parasitic capacitance coupled with bit line pairs associated with a memory cell array while the flash write data buffer unit produces small differential voltage levels indicative of a flash write data bit for sense amplifier circuits.

In accordance with the present invention, there is provided a random access memory device selectively entering a usual write-in phase, a usual read-out phase and a flash write phase of operation, comprising: a) a plurality of random access memory cells arranged in rows and columns, and respectively storing data bits; b) a plurality of first bit line pairs respectively coupled with the columns of the random access memory cells; c) a plurality of word lines respectively coupled with the rows of the random access memory cells, and selectively activated for allowing data bits to be read out from random access memory cells coupled therewith to the associated first bit line pairs in the form of small differential voltage level, the word lines being further operative to allow data bits respectively indicated by large differential voltage levels on the plurality of first bit line pairs to be written into the random access memory cells coupled therewith; d) a plurality of second bit line pairs respectively associated with the plurality of first bit line pairs; e) a plurality of sense amplifier circuits respectively coupled with the plurality of second bit line pairs, and activated for respectively developing small differential voltage levels into the large differential voltage levels; f) a first transfer gate unit coupled between the plurality of first bit line pairs and the plurality of second bit line pairs, and responsive to a timing controlling signal for interconnecting the plurality of first bit line pairs and the plurality of second bit line pairs; g) a flash write data buffer unit responsive to a flash write data bit for producing a small differential voltage level on a flash write data bus; h) a second transfer gate unit coupled between the flash write data bus and the plurality of second bit line pairs, and responsive to a gate control signal for distributing the small differential voltage level indicative of the flash write data bit to the plurality of second bit line pairs in the flash write phase of operation; and i) a timing controller for producing the timing controlling signal, the timing controlling signal causing the first transfer gate unit to interconnect the plurality of first bit line pairs and the plurality of second bit line pairs except for a first predetermined time period containing at least a time period between activation of the sense amplifier circuits and development into the large differential voltage levels in the usual read-out phase, the timing controlling signal causing the first transfer gate unit to interconnect the plurality of first bit line pairs and the plurality of second bit line pairs except for a second time period containing at least a time period between transmission of the small differential voltage level to the plurality of second bit line pairs and development into the large differential voltage levels in the flash write phase.

BRIEF DESCRIPTION OF THE DRAWINGS

The features and advantages of the random access memory device according to the present invention will be more clearly understood from the following description taken in conjunction with the accompanying drawings in which.

DESCRIPTION OF THE PREFERRED EMBODIMENT

Figure 1:
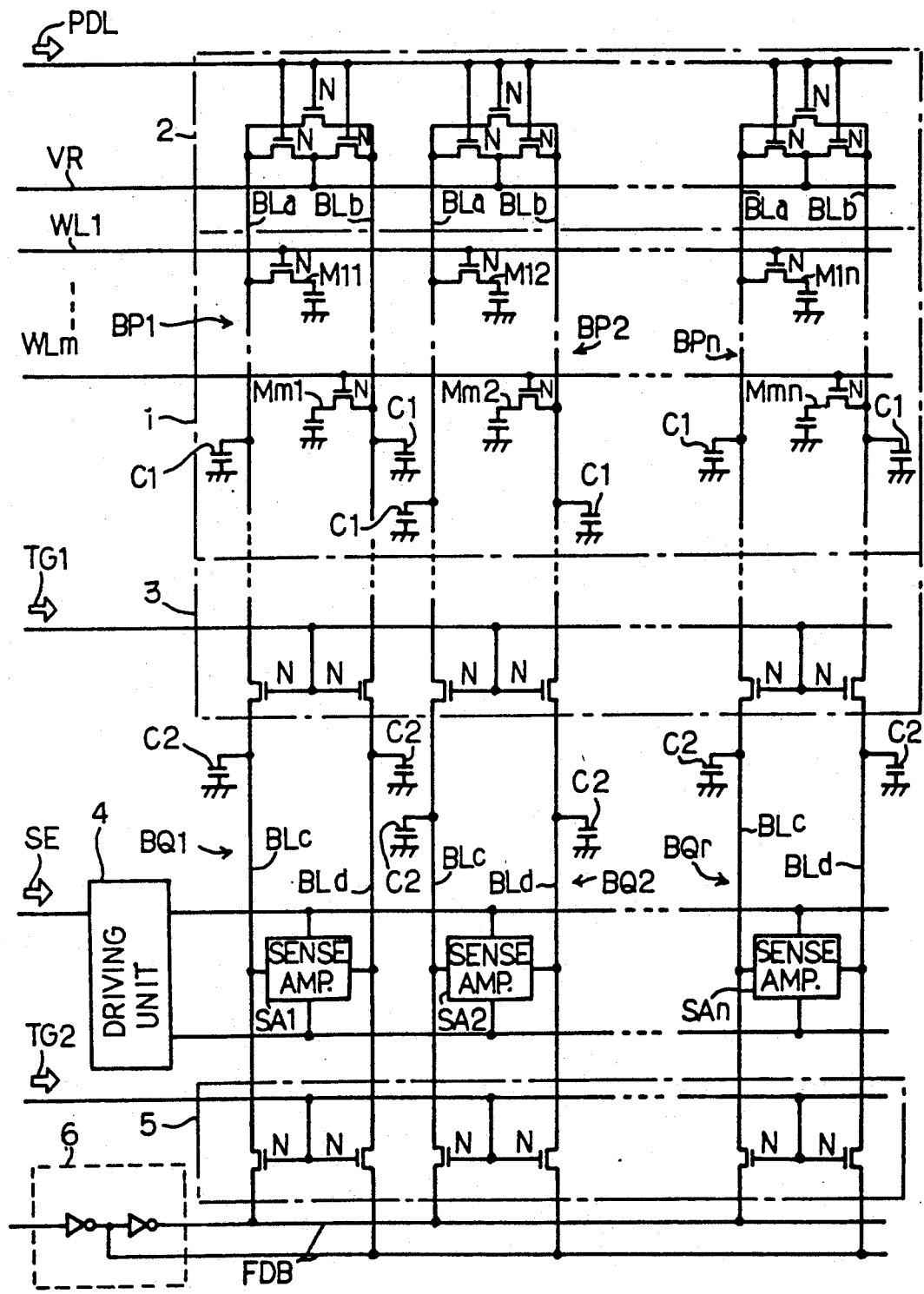
FIG. 1 is a circuit diagram showing the arrangement of the prior art dynamic random access memory device.
Figure 2:
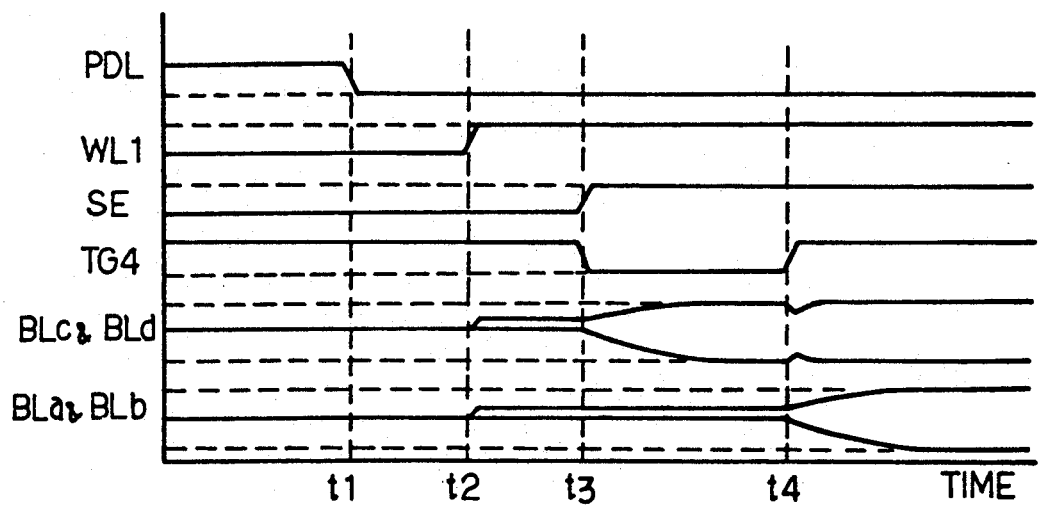
FIG. 2 is a diagram showing the waveforms on essential signal lines of the prior art dynamic random access memory device in a usual read-out cycle.
Figure 3:
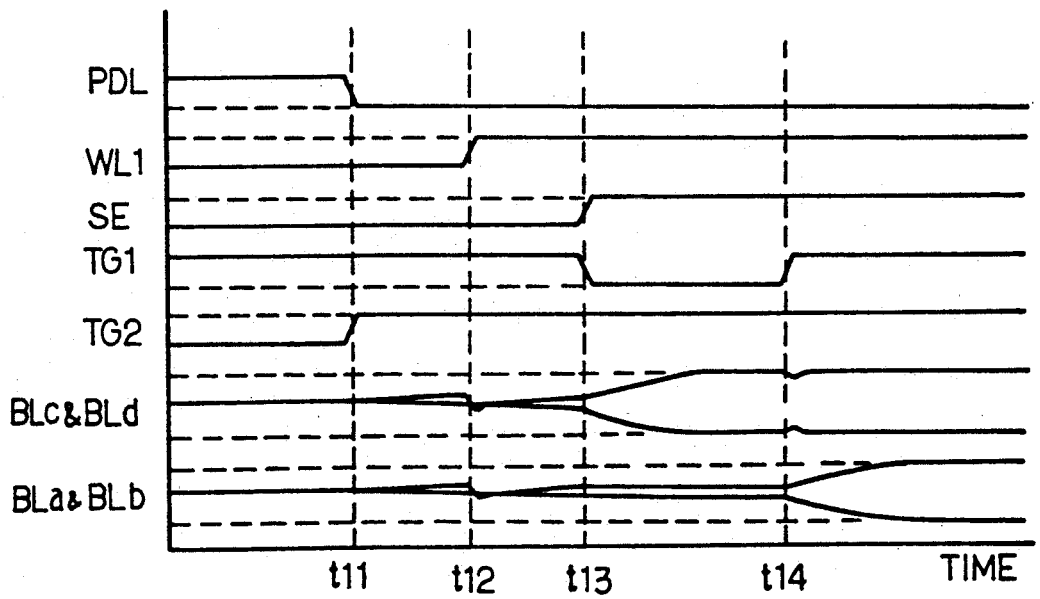
FIG. 3 is a diagram showing the waveforms on the essential signal lines in a flash write cycle.
Figure 4:
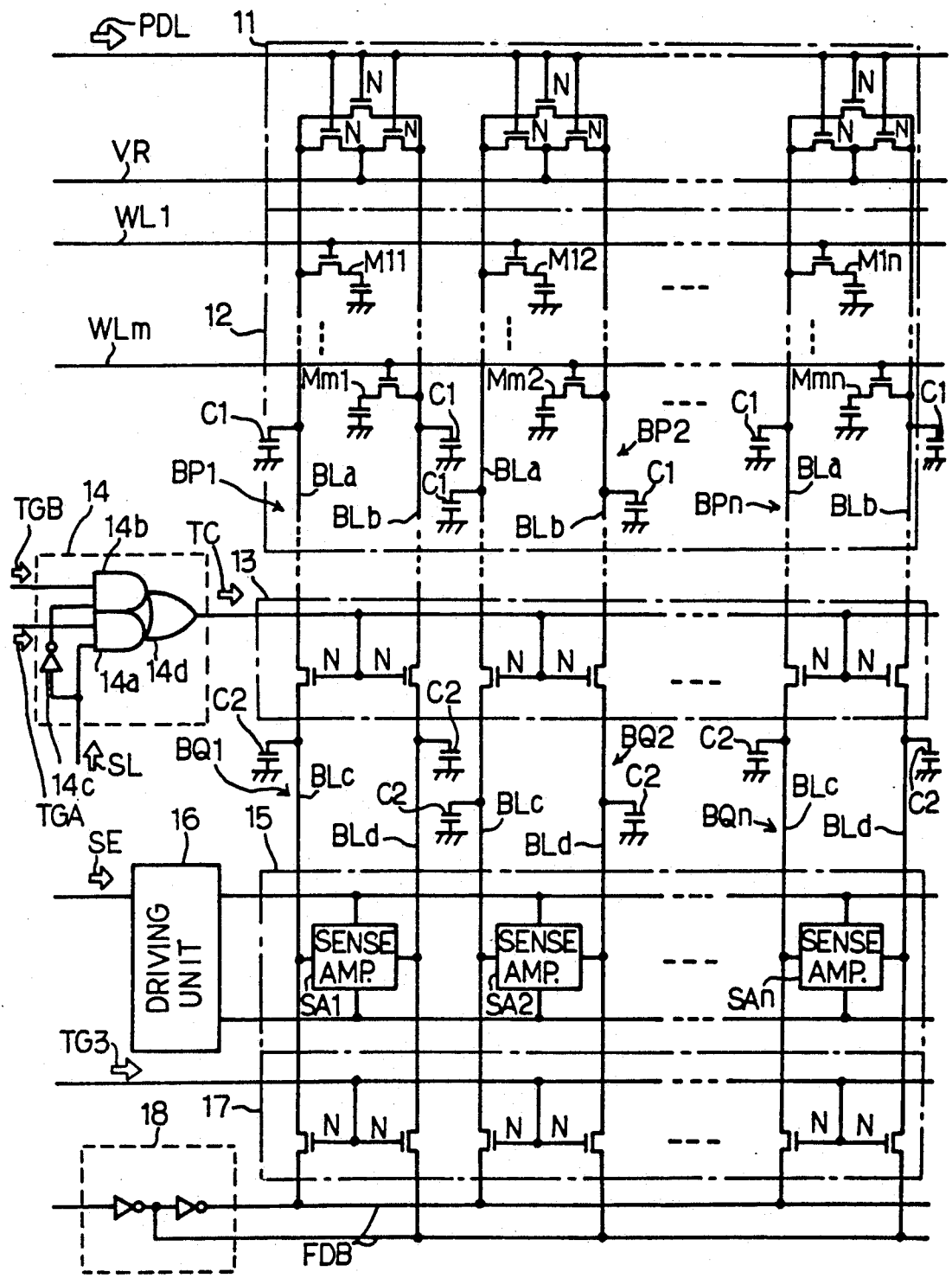
FIG. 4 is a circuit diagram showing the arrangement of a dynamic random access memory device according to the present invention.

Referring to FIG. 4 of the drawings, a dynamic random access memory device embodying the present invention is fabricated on a single semiconductor chip, and largely comprises a precharging unit 11, a memory cell array 12, a first transfer gate unit 13 associated with a timing controller 14, a sense amplifier unit 15 associated with a driving unit 16, a second transfer gate unit 17, and a flash write data buffer unit 18 coupled with a flash write data bus FDB. The memory cell array 12 is fabricated from a plurality of memory cells M11, M12 M1n, Mm1, Mm2 and Mmn arranged in rows and columns, and each of the memory cells M11 to Mmn is implemented by a series combination of an n-channel enhancement type transfer transistor and a storage capacitor. A plurality of first bit line pairs BP1, BP2 and BPn are respectively associated with the columns of the memory cells M11 to Mmn, and each of the first bit line pairs has bit lines BLa and BLb. The memory cells of each row are alternately coupled with the bit lines BLa and BLb, and the n-channel enhancement type transfer transistors are coupled at the drain nodes thereof with the associated bit lines BLa and BLb. Word lines WL1 to WLm are respectively associated with the rows of the memory cells M11 to Mmn, and are selectively driven for conducting the storage capacitors of the associated memory cells with the bit lines BLa or BLb. A parasitic capacitance coupled with each bit line BLa or BLb is labeled with C1 in FIG. 4.

The precharging unit 11 has n-channel enhancement type precharge transistors coupled between a source line VR of a precharging level and the bit lines BLa and BLb, and n-channel enhancement type equalizing transistors coupled between the bit lines BLa and the bit lines BLb. The n-channel enhancement type precharging transistors and the n-channel enhancement type equalizing transistors are responsive to a precharging signal PDL, and are operative to precharge the bit lines BLa and BLb and to equalize the bit lines BLa to the bit lines BLb.

The sense amplifier unit 15 has sense amplifier circuits SA1, SA2 and SAn, and each of the sense amplifier circuits SA1 to SAn develops a small differential voltage level into a large differential voltage level when the driving unit 15 drives the sense amplifier circuits SA1 to SAn in response to an activation signal SE. The sense amplifier circuits SA1 to SAn are associated with second bit line pairs BQ1, BQ2 and BQn each consisting of bit lines BLc and BLd, and a parasitic capacitance C2 is coupled with each of the bit lines BLc and BLd. Though not shown in the drawings, the second bit line pairs BQ1 to BQn are further coupled with a column selecting unit, and the column selecting unit selectively interconnects the second bit line pairs BQ1 to BQn and an input/output data buffer unit.

The first transfer gate unit 13 comprises n-channel enhancement type transfer transistors respectively coupled between the bit lines BLa and BLb and the bit lines BLc and BLd, and responsive to a timing control signal TC supplied from the timing controller 14. The timing controller 14 is fabricated from two AND gates 14a and 14b, an inverting circuit 14c and a OR gate 14d, and the AND gates 14a and 14b are responsive to a selecting signal SL for supplying either first or second gate control signal TGA or TGB to the OR gate 14d, thereby producing the timing control signal TC. Therefore, the timing controller 14 is of the selector in this instance. As will be described hereinlater in connection with the circuit behavior, the first gate controlling signal TGA enters inactive level upon or before the sense amplifier circuits SA1 to SAn are activated, and is recovered from the inactive level upon or after development into the large differential voltage levels. The inactive level of the first gate controlling signal TGA starts after small differential voltage levels take place on the basis of the data bits stored in the memory cells. On the other hand, the second gate controlling signal TGB enters inactive level upon or before transmission of the small differential voltage level indicative of a flash write data bit, and is recovered from the inactive level upon or after development into the large differential voltage levels. The first and second gate control signals TGA and TGB are independently produced by a timing generator (not shown), and the timing generator is well known to a person skilled in the art. For this reason, no further description is incorporated hereinbelow.

The second transfer gate unit 17 is also fabricated from n-channel enhancement type transfer transistors coupled between the second bit line pairs BQ1 to BQn and the flash write data bus FDB. The second transfer gate unit 17 is responsive to a third gate control signal TG3, and is operative to distribute a small differential voltage level indicative of a flash write data bit to the second bit line pairs BQ1 to BQn. The flash write data buffer unit 18 drives all of the second bit line pairs BQ1 to BQn. However, the flash write data buffer unit is fabricated from small-sized component transistors, and, accordingly, occupies a small amount of real estate on the semiconductor chip.

The dynamic random access memory device thus arranged selectively enters a usual read-out phase, a usual write-in phase and a flash write phase of operation. In the usual write-in phase of operation, a write-in data bit is supplied from the input/output data buffer unit through the column selecting unit to one of the second bit line pairs BQ1 to BQn, and a small differential voltage level indicative of the write-in data bit is developed into a large differential voltage level by the associated sense amplifier circuit. The large differential voltage level is also indicative of the write-in data bit, and the write-in data bit is written into one of the memory cells coupled with an activated word line.

Figure 5:
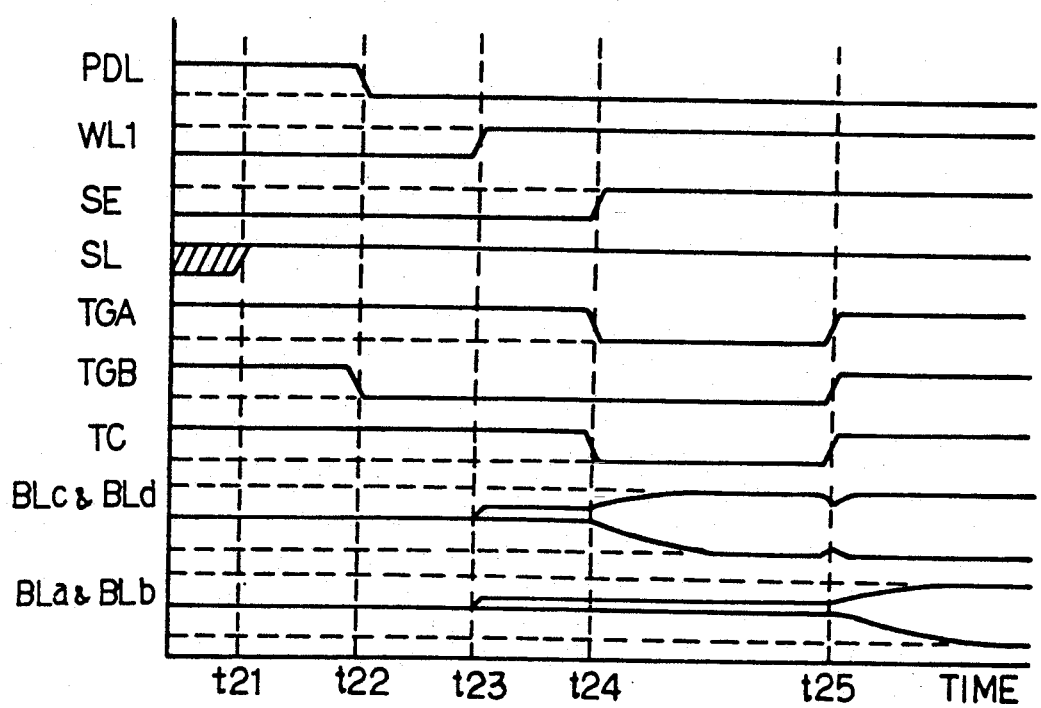
FIG. 5 is a diagram showing the waveforms on essential signal lines incorporated in the dynamic random access memory device shown in FIG. 4 in a usual read-out cycle.

FIG. 5 shows the waveforms on essential signals in the usual read-out phase of operation. Assuming now that the memory cell M11 is accessed in the usual read-out phase of operation, the precharging signal PDL is lifted to an active high voltage level, and the precharging unit 11 precharges and equalizes the bit lines BLa and BLb at the precharging level. Since the selecting signal SL is lifted to a high voltage level at time t21, the timing controller 14 produces the timing controlling signal TC from the first gate control signal TGA, and remains in a high voltage level. Therefore, the first transfer gate unit 13 interconnects the first bit line pairs BP1 to BPn and the second bit line pairs BQ1 to BQn, respectively, and the bit line pairs BQ1 to BQn also reach the precharging level. However, the activation signal SE is kept low, and the sense amplifier circuits SA1 to SAn remain inactive.

If the precharging signal PDL is decayed at time t22, the precharging unit 11 isolates the bit line pairs BP1 to BPn from the source line VR, and the bit line pairs BP1 to BPn and BQ1 to BQn enter floating state. The word line WL1 is lifted to the active high voltage level at time t23, and the storage capacitors of the memory cells M11 to M1n are coupled with the associated bit lines BLa. The memory cell M11 produces a small differential voltage level between the bit lines BLa and BLb of the first bit line pair BP1, and the small differential voltage is transferred through the first transfer gate unit 13 to the second bit line pair BQ1. At time t24, the first gate control signal TGA and, accordingly, the timing controlling signal TC are decayed, and the activation signal SE goes up to an active level. The n-channel enhancement type transfer transistors of the first transfer gate unit 13 concurrently turn off, and the sense amplifier circuits SA1 to SAn are blocked from the parasitic capacitances C1. The sense amplifier circuits SA1 to SAn are activated with the activation signal SE, and respectively develop the small differential voltage levels on the second bit line pairs BQ1 to BQn into large differential voltage levels. The sense amplifier circuits SA1 to SAn are expected to drive the parasitic capacitances C2 only, and, for this reason, the small differential voltage levels are rapidly developed into the large differential voltage levels, respectively. However, the differential voltage levels on the bit line pairs BP1 to BPn remain small, because the first transfer gate unit 13 has been turned off. The large differential voltage levels are transferred to the column selecting unit (not shown), and the large differential voltage level on the bit line pair BQ1 is supplied to the input/output data buffer unit (not shown) for producing an output data signal. The first gate control signal TGA and, accordingly, the timing controlling signal TC are lifted to the high voltage level again at time t25, and the large differential voltage levels developed by the sense amplifier circuits SA1 to SAn are fed back through the first transfer gate unit 13 to the first bit line pairs BP1 to BPn for refreshing. As described hereinbefore, the sense amplifier circuits SA1 to SAn are activated at time t24, and the large differential voltage levels appear at times t25. The first transfer gate unit 13 turns off between time t24 and t25.

Figure 6:
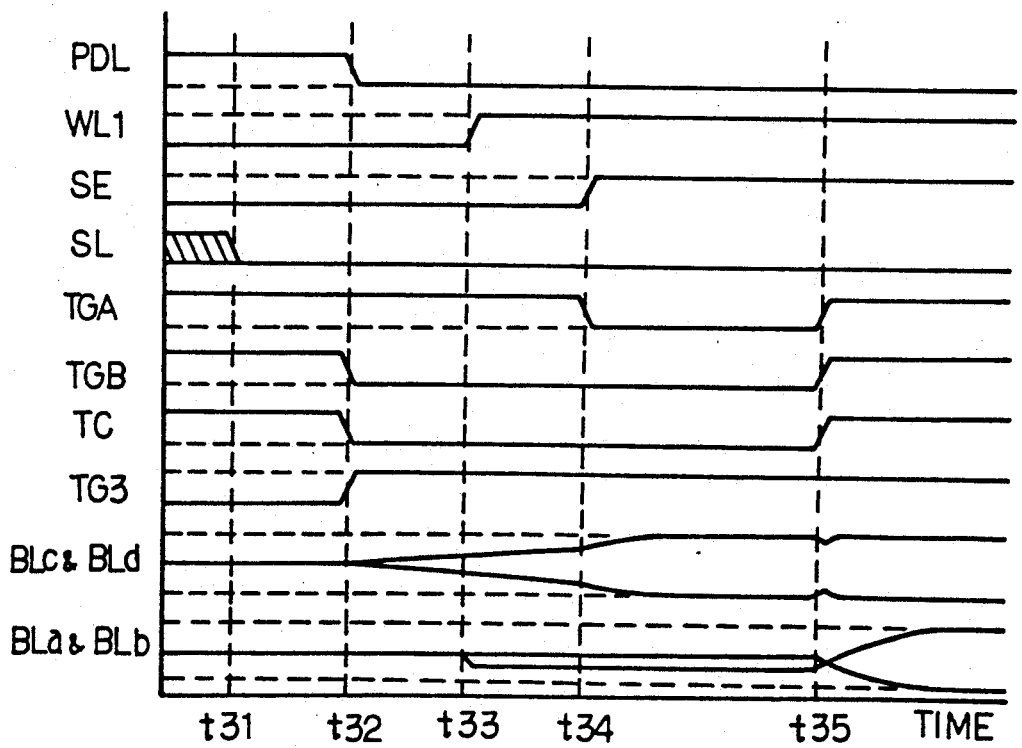
FIG. 6 is a diagram showing the waveforms on the essential signal lines in a flash write cycle.

FIG. 6 illustrates the flash write phase of operation. At time t31, the selecting signal SL goes down to a low voltage level, the timing controller 14 produces the timing controlling signal from the second gate controlling signal TGB. At time t32, the precharging signal PDL goes down so as to isolate the bit line pairs BP1 to BPn from the source line VR, the third gate control signal TG3 goes up to couple the flash write data bus FDB with the bit line pairs BQ1 to BQn, and the second gate control signal TGB and, accordingly, the timing controlling signal TC goes down for blocking the flash write data buffer unit 18 from the parasitic capacitances C1. Since the third gate control signal TG3 allows the second transfer gate unit 17 to turn on from line t32, the small differential voltage indicative of a flash write data bit is transmitted to the bit line pairs BQ1 to BQn. Then, the flash write data buffer unit 18 drives the bit line pairs BQ1 to BQn, and produces small differential voltage levels indicative of a flash write data bit on the bit line pairs BQ1 to BQn. Since the word line WL1 is lifted to the active high voltage level at time t33, the data bits are read out from the memory cells M11 to M1n, and small differential voltage levels are produced on the bit line pairs BP1 to BPn, respectively. Thus; the flash write data buffer unit 18 merely drives the parasitic capacitances C2 coupled to the bit line pairs BQ1 to BQn, and, for this reason, the flash write data buffer unit with small current driving capability can produce the small differential voltage levels on the bit line pairs BQ1 to BQn.

The activation signal SE is lifted to the active level at time t34, and the driving unit 16 allows the sense amplifier circuits SA1 to SAn to develop the small differential voltage levels on the bit line pairs BQ1 to BQn into large differential voltage levels. Although the first gate controlling signal TGA is decayed at time t34, the first gate controlling signal TGA has no influence on the timing controlling signal TC.

The second gate controlling signal TGB and, accordingly, the timing controlling signal TC is recovered from the inactive level to the active level at time t35, and the first transfer gate unit 13 interconnects the bit line pairs BQ1 to BQn and the bit line pairs BP1 to BPn. Thus, the first transfer gate unit 13 turns off from time t32 to time t35. The sense amplifier circuits SA1 to SAn cooperate the flash write data buffer unit 18, and the large differential voltage levels each indicative of the flash write data bit are transferred to the bit line pairs BP1 to BPn. Even if a data bit read out from the memory cell M11 is opposite in logic level to the flash write data bit, the sense amplifier circuit SA1 and the flash write data buffer unit 18 quickly inverse the voltage levels between the bit lines BLa and BLb. Finally, the flash write data bit indicated by the large differential voltage levels is concurrently written into the memory cells M11 to M1n.

As will be understood from the foregoing description, the flash write data buffer unit 18 charges or discharges the parasitic capacitances C2 coupled with the bit line pairs BQ1 to BQn only, and, for this reason, the small-sized flash write data buffer unit 18 is incorporated in the dynamic random access memory device for the flash write cycle without sacrifice of the operation speed.

Although particular embodiments of the present invention have been shown and described, it will be obvious to those skilled in the art that various changes and modifications may be made without departing from the spirit and scope of the present invention. For example, although the timing controller 14 is implemented by a selector in the above described embodiment, various arrangements may be formed with logic gates.

What is claimed is:

1. A random access memory device selectively entering a usual write-in phase, a usual read-out phase and a flash write phase of operation, comprising:
   a) a plurality of random access memory cells arranged in rows and columns, and respectively storing data bits;
   b) a plurality of first bit line pairs respectively coupled with the columns of said random access memory cells;
   c) a plurality of word lines respectively coupled with the rows of said random access memory cells, and selectively activated for allowing data bits to be read out from random access memory cells coupled therewith to the associated first bit line pairs in the form of small differential voltage level, said word lines being further operative to allow data bits respectively indicated by large differential voltage levels on said plurality of first bit line pairs to be written into said random access memory cells coupled therewith;
   d) a plurality of second bit line pairs respectively associated with said plurality of first bit line pairs;
   e) a plurality of sense amplifier circuits respectively coupled with said plurality of second bit line pairs, and activated for respectively developing small differential voltage levels into said large differential voltage levels;
   f) a first transfer gate unit coupled between said plurality of first bit line pairs and said plurality of second bit line pairs, and responsive to a timing controlling signal for interconnecting said plurality of first bit line pairs and said plurality of second bit line pairs;
   g) a flash write data buffer unit responsive to a flash write data bit for producing a small differential voltage level on a flash write data bus;
   h) a second transfer gate unit coupled between said flash write data bus and said plurality of second bit line pairs, and responsive to a gate control signal for distributing said small differential voltage level indicative of said flash write data bit to said plurality of second bit line pairs in said flash write phase of operation; and
   i) a timing controller for producing said timing controlling signal, said timing controlling signal causing said first transfer gate unit to interconnect said plurality of first bit line pairs and said plurality of second bit line pairs except for a first predetermined time period containing at least a time period between activation of said sense amplifier circuits and completion of development into said large differential voltage levels in said usual read-out phase, said timing controlling signal causing said first transfer gate unit to interconnect said plurality of first bit line pairs and said plurality of second bit line pairs except for a second time period containing at least a time period between transmission of said small differential voltage level to said plurality of second bit line pairs and completion of development into said large differential voltage levels in said flash write phase.

2. A random access memory device as set forth in claim 1, in which said timing controller is implemented by a selector responsive to a selecting signal for transferring either first or second gate controlling signal to said first transfer gate unit as said timing controlling signal, said first gate controlling signal keeping an active level except for said first predetermined time period in said usual read-out phase, said second gate controlling signal keeping an active level except for said second time period in said flash write phase.

3. A random access memory device as set forth in claim 2, in which said timing controller comprises a first AND gate supplied with said selecting signal and said first gate controlling signal, a second AND gate supplied with the complementary signal of said selecting signal and said second gate controlling signal, and an OR gate coupled with said first and second AND gates for producing said timing controlling signal.

4. A random access memory device as set forth in claim 1, in which said first time period starts after production of said small differential voltage levels respectively indicative of said data bits read out from said memory cells and not later than said activation of said sense amplifier circuits.

5. A random access memory device as set forth in claim 1, in which said transmission of said small differential voltage level starts upon termination of a precharging operation on said plurality of first bit line pairs and said plurality of second bit line pairs.

* * * * *